United States Patent [19]

Iwasaki

[11] Patent Number: 5,599,389
[45] Date of Patent: Feb. 4, 1997

[54] COMPOUND SEMICONDUCTOR AND METHOD OF MANUFACTURING THE SAME

[75] Inventor: Hiroshi Iwasaki, Yokohama, Japan

[73] Assignee: Kabushiki Kaisha Toshiba, Kawasaki, Japan

[21] Appl. No.: 340,478

[22] Filed: Nov. 14, 1994

Related U.S. Application Data

[63] Continuation of Ser. No. 232,583, Apr. 25, 1994, abandoned, which is a continuation of Ser. No. 7,024, Jan. 21, 1993, abandoned, which is a continuation of Ser. No. 653,295, Feb. 11, 1991, abandoned.

[30] Foreign Application Priority Data

Feb. 14, 1990 [JP] Japan ................................. 2-032697

[51] Int. Cl.$^6$ ................................. H01L 21/02
[52] U.S. Cl. .................. 117/88; 117/108; 117/954; 117/955; 437/96; 437/107; 437/109; 437/912
[58] Field of Search ................... 117/88, 108, 954, 117/955; 437/96, 109, 107, 912

[56] References Cited

U.S. PATENT DOCUMENTS

| | | | |
|---|---|---|---|
| 4,233,092 | 11/1980 | Harris et al. | 437/107 |
| 4,281,029 | 7/1981 | Takagi et al. | 437/107 |
| 4,632,710 | 12/1986 | Van Rees | 437/107 |
| 4,732,870 | 3/1988 | Mimura | 437/107 |
| 4,746,626 | 5/1988 | Eda et al. | 437/107 |
| 4,804,635 | 2/1989 | Young | 437/192 |
| 4,935,381 | 6/1990 | Speckman et al. | 437/96 |

FOREIGN PATENT DOCUMENTS

| | | | |
|---|---|---|---|
| 54-106169 | 8/1979 | Japan | 437/96 |
| 55-91816 | 7/1980 | Japan . | |
| 56-27972 | 3/1981 | Japan | 437/104 |
| 59-184570 | 10/1984 | Japan . | |
| 62-65407 | 3/1987 | Japan . | |
| 64-82569 | 3/1989 | Japan | 437/104 |
| 1-179411 | 7/1989 | Japan | 437/96 |

OTHER PUBLICATIONS

Applied Physics Letters, vol. 37, No. 8, Oct. 1980, New York, U.S.A., pp. 734–737; "Growth of high-quality epitaxial GaAs films by sputter deposition", Barnett et al.

Applied Physics Letters, vol. 42, No. 1, Jan. 1983, New York, U.S.A., pp. 66–68; "Growth of high-purity GaAs layers by molecular beam epitaxy", Hwang et al.

Applied Physics Letters, vol. 42, No. 2, Jan. 1983, New York, U.S.A., pp. 178–180; "Undoped, semi-insulating GaAs layers grown by molecular beam epitaxy", Temkin et al.

Materials Letters, vol. 5, No. 4, Mar. 1987, Amsterdam, NL, pp. 129–133; "In-Doped GaAs Substrate Assessment for Thin Film Applications", Ozawa et al.

Journal of Crystal Growth, vol. 100, No. 1/2, Feb. 1990, Amsterdam, NL, pp. 5–10; "Characteristics of Carbon Incorporation in GaAs Grown by Gas Source Molecular Beam Epitaxy", Gotoda et al.

Primary Examiner—Robert Kunemund
Attorney, Agent, or Firm— Finnegan, Henderson, Farabow, Garrett & Dunner, L.L.P.

[57] ABSTRACT

According to this invention, there is provided a compound semiconductor substrate including, on a compound semiconductor base containing a high-concentration impurity, a high-resistance single-crystal layer consisting of the same compound semiconductor as the compound semiconductor constituting the base. Active elements are formed in the high-resistance single-crystal layer.

6 Claims, 3 Drawing Sheets

COMPOUND SEMICONDUCTOR AND METHOD OF MANUFACTURING THE SAME

This application is a continuation of application Ser. No. 08/232,583, filed Apr. 25, 1994, now abandoned; which was a continuation of application Ser. No. 08/007,024, filed Jan. 21, 1993, now abandoned; which was a continuation of application Ser. No. 07/653,295, filed Feb. 11, 1991, now abandoned.

BACKGROUND OF THE INVENTION

1. Field of the Invention

The present invention relates to a compound semiconductor substrate and a method of manufacturing the same.

2. Description of the Related Art

GaAs is known well as a type of a compound semiconductor. When the GaAs is made to have a resistivity of $10^6$ Ω·cm or more, it has semi-insulating characteristics. When active elements are formed in a semi-insulating GaAs substrate, they are not advantageously required to be electrically isolated from each other using a field insulating film. In order to obtain this advantage, a semi-insulating GaAs single-crystal is conventionally made using a single-crystal manufacturing technique such as an LEC method, and the single-crystal is sliced to manufacture semi-insulating GaAs substrates.

Since the semi-insulating GaAs single-crystal is constituted by bonding two types of atoms, a shearing stress acting inside the GaAs single-crystal is stronger than that of a silicon single-crystal, and a dislocation density in the GaAs single-crystal is disadvantageously increased.

SUMMARY OF THE INVENTION

The present invention has been made in consideration of the above problem, and has as its object to provide a compound semiconductor substrate having a low dislocation density and a method of manufacturing the same.

The above object can be achieved by the following arrangement.

According to the present invention, a compound semiconductor substrate includes, on a compound semiconductor base containing a high-concentration impurity, a high-resistance single-crystal layer consisting of the same compound semiconductor as that of the compound semiconductor base.

According to the present invention, a method of manufacturing the compound semiconductor substrate comprises the step of epitaxially growing the same compound semiconductor as a compound semiconductor base to form a high-resistance single-crystal layer on a major surface of the compound semiconductor base containing a high-concentration impurity.

According to the compound semiconductor substrate and the method of manufacturing the same, since a high-concentration impurity is contained in the compound semiconductor base, a dislocation density can be decreased. When the same semiconductor as that of the compound semiconductor base is epitaxially grown on the compound semiconductor base having a low dislocation density, a high-resistance single-crystal layer having a low dislocation density, i.e., a single-crystal layer having semi-insulating characteristics can be formed. When the high-resistance single-crystal layer is formed in a portion where an active element is to be formed, a compound semiconductor substrate having a low dislocation density and even advantageously having a high-resistance, i.e., semi-insulating characteristics can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be described below with reference to the accompanying drawings.

Figure 1:
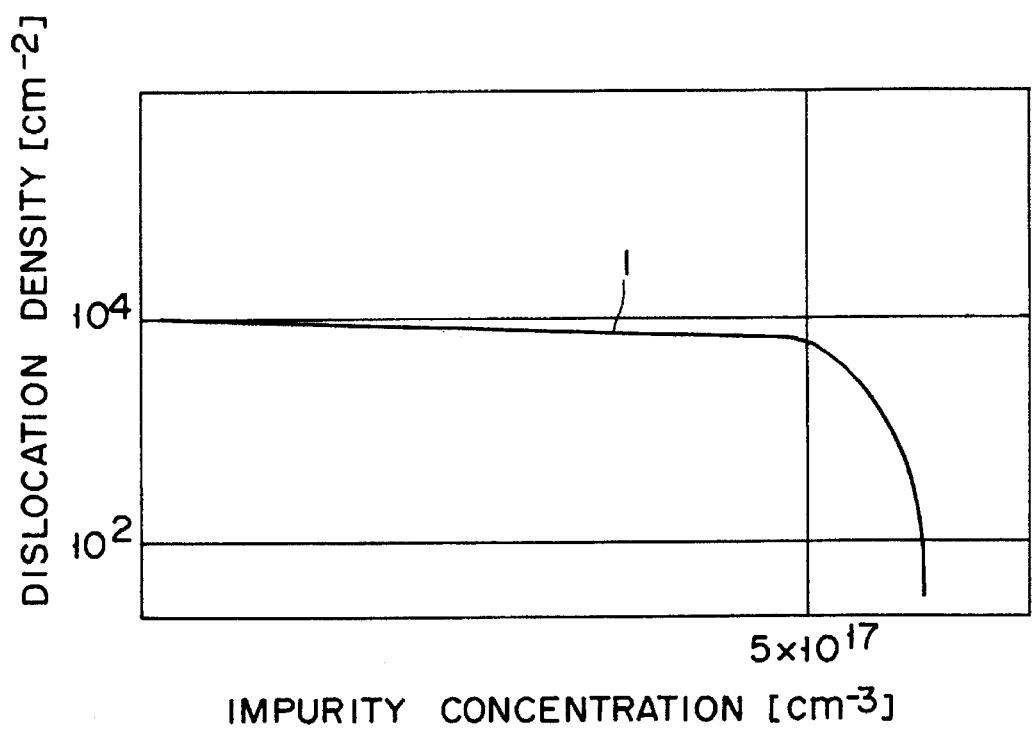
FIG. 1 is a graph showing a relationship between an impurity concentration and a dislocation density.

As a method of relieving a shearing stress, a phenomenon wherein an impurity is doped in a single-crystal to decrease a dislocation density in the single-crystal is known. A curve I in FIG. 1 indicates a decrease in dislocation density when an impurity is doped in GaAs after a crystal is grown. The decrease in dislocation density typically occurs when an n-type impurity is doped. As is indicated by the curve I in FIG. 1, a doping concentration of the impurity at a time when the dislocation density is rapidly decreased is $5\times10^{17}$ cm$^{-3}$ or more. This phenomenon is not limited to the GaAs, and it occurs in a compound semiconductor such as GaP or InP consisting of two elements. Silicon or carbon is used as an n-type impurity, and selenium, magnesium or the like is used as a p-type impurity. When the n- or p-type impurity is used, a doping concentration is set to be $5\times10^{17}$ cm$^{-3}$ or more to obtain a compound semiconductor single-crystal having a low dislocation density.

Figure 2A:
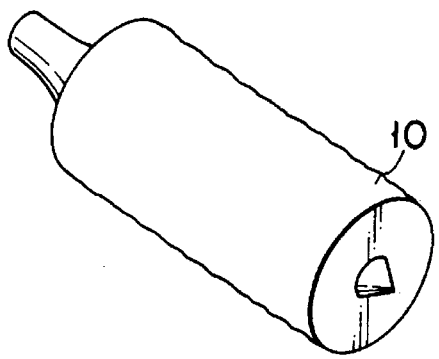
FIGS. 2A to 2E are perspective views showing a compound semiconductor substrate according to the embodiment of the present invention in the order of manufacturing steps.
Figure 2D:
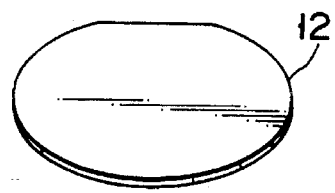
Figure 2B:
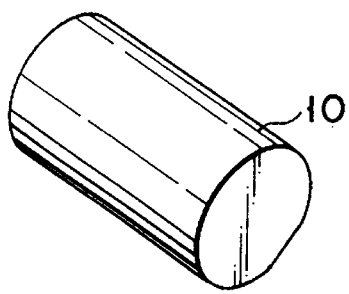
Figure 2E:
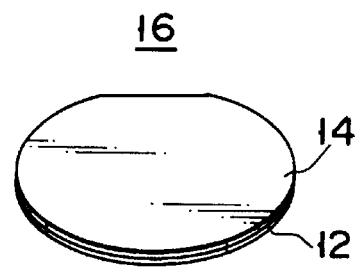
Figure 2C:
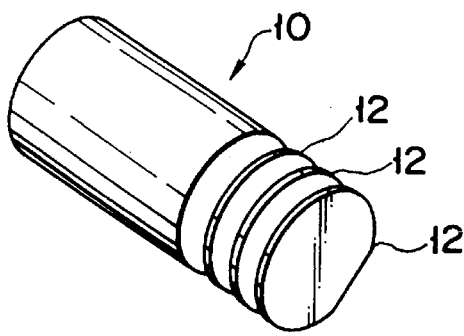

The present invention is made on the basis of the above phenomenon, n-type GaAs in which a single-crystal, e.g., a silicon element, having a density of $5\times10^{17}$ cm$^{-3}$ or more is doped as an impurity is grown by an LEC method or an HB method, thereby forming an n-type GaAs single-crystal 10 having a low dislocation density (FIG. 2A). The single-crystal 10 is cut (FIG. 2B). The cut single-crystal 10 is sliced to obtain an n-type GaAs base 12 (FIG. 2C). The base 12 sliced as described above is prospectively used as a substrate for epitaxial growth. Mirror polishing is performed on the surface of the base 12, and the base 12 is washed by a chemical treatment to clean its mirror surface (FIG. 2D). A high-resistance GaAs single-crystal layer 14 having a resistivity of $10^6$ Ω·cm is epitaxially grown on the surface of the base 12 (FIG. 2E). In order to form the single-crystal layer 14 having a resistivity of $10^6$ Ω·cm or more, an amount of impurity contained in GaAs is decreased, or the GaAs is undoped. The high-resistance GaAs single-crystal layer 14 is prospectively used as a portion where an active element is to be formed.

A compound semiconductor substrate 16 according to the present invention is finished by the above method.

A dislocation density of a single-crystal layer which is epitaxially grown is generally lower than that of a substrate on which the single-crystal layer is grown. In the GaAs substrate 16 with the above arrangement, the dislocation density of the n-type GaAs base 12 is decreased by doping an impurity, and the dislocation density of the GaAs single-crystal layer 14 grown on the base 12 is further decreased. At present, in a GaAs substrate consisting of an undoped GaAs single-crystal, a dislocation density is about 50,000 $cm^{-2}$ at a portion where an active element is to be formed. In the GaAs substrate 16 according to the present invention, the dislocation density of the GaAs single-crystal layer 14 where an active element is to be formed can be set to be 100 $cm^{-2}$ or less.

Figure 3:
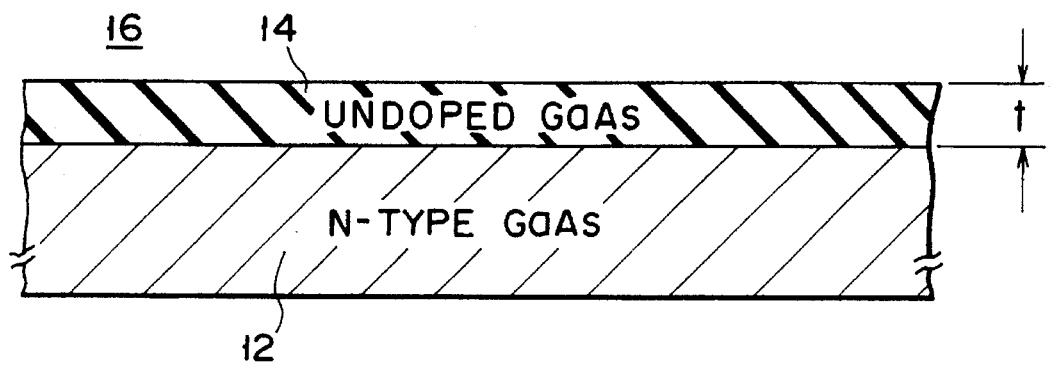
FIG. 3 is a partially enlarged sectional view showing the compound semiconductor substrate in FIG. 2E.
Figure 4:
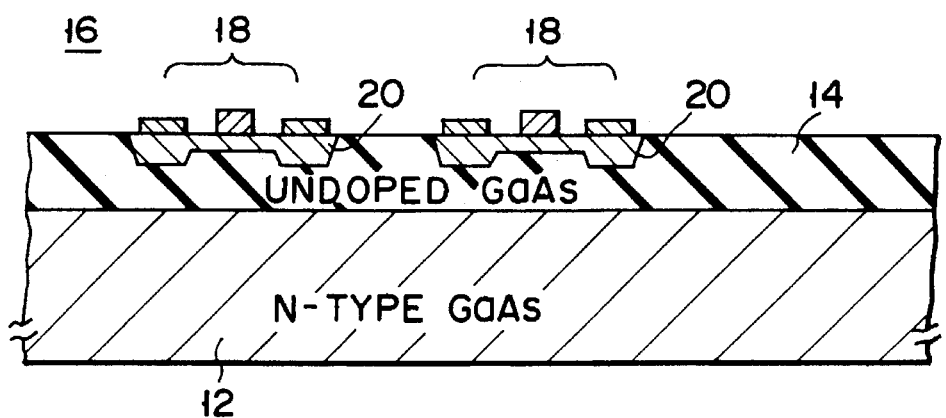
FIG. 4 is a sectional view showing a condition wherein an active element is formed in the compound semiconductor substrate in FIG. 3.

FIG. 3 is a partially enlarged sectional view showing the GaAs substrate 16 shown in FIG. 2E, and FIG. 4 is a sectional view showing a condition wherein an active element is formed on the GaAs substrate 16.

As shown in FIG. 3, the GaAs single-crystal layer 14 which is undoped to have a high-resistance is stacked on the n-type GaAs base 12 by epitaxial growth. The high-resistance GaAs single-crystal layer 14 is a layer where an active element 18 is prospectively formed, and an active region 20 prospectively serving as a source, a drain, and a channel of the active element 18 is formed on the single-crystal layer 14. Since the high-resistance GaAs single-crystal layer 14 is formed to have a resistivity of $10^6$ Ω·cm or more, a field insulating film for isolating the active elements 18 from each other need not be formed (the high-resistance GaAs single-crystal layer 14 has semi-insulating characteristics). In addition, since the high-resistance GaAs single-crystal layer 14 is epitaxially grown on the n-type GaAs base 12 having a low dislocation density, the dislocation density of the single-crystal layer 14 is also low. The active elements 18 formed on the GaAs single-crystal layer 14 having a low dislocation density have excellent characteristics, and variations in characteristics of all the active elements 18 can be decreased. Since the variations in characteristics of the active elements 18 can be decreased, in all cases wherein an IC/LSI is formed and wherein an individual semiconductor device is formed, the performance of the IC/LSI and the individual semiconductor device can be improved, and a yield of the products can be improved.

In the compound semiconductor substrate 16 according to the present invention, a thickness t of the high-resistance GaAs single-crystal layer 14 is required to be a minimum thickness required for forming the active region 20. For example, at present, when the thickness t of the high-resistance GaAs single-crystal layer 14 is set to be about 500 nm or more, it can sufficiently cope with formation of the active region 20. When the high-resistance GaAs single-crystal layer 14 is epitaxially grown, a method of growing a crystal at an atomic layer level such as MBE, MOCVD, or MOMBE is preferably used from the viewpoint of improvements of a film quality and controllability of the film thickness t.

This embodiment has been described in the combination of the GaAs base 12 containing a high-concentration impurity and the GaAs single-crystal layer 14 which is undoped to have a high resistance. However, the same effect as described above can be obtained with the following combinations.

1) GaP is used as the base 12, and GaP is used as the single-crystal layer 14.

2) InP is used as the base 12, and InP is used as the single-crystal layer 14.

In the above combinations, as in the above embodiment, the base 12 contains an impurity to have a low dislocation density. The single-crystal layer 14 stacked thereon is undoped to have a high resistance so as to have semi-insulating characteristics.

As an impurity having an effect of decreasing the dislocation density of the base 12, carbon, selenium, magnesium, or the like is used in addition to silicon. When any of these impurities is doped not only in a GaAs single-crystal but also in a GaP or InP single-crystal, the dislocation density of the single-crystal can be decreased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a compound semiconductor device, said method comprising the steps of:

forming a doped single crystal III-V compound semiconductor ingot containing elements belonging to Groups III and V of the periodic system and impurities of $5 \times 10^{17}$ $cm^{-3}$ or more for rendering said III-V compound semiconductor ingot conductive and reducing low dislocation density of said III-V compound semiconductor ingot;

slicing said doped ingot to obtain a plurality of doped single-crystal substrates with said substrates having a low dislocation density;

forming a thin semiinsulating epitaxial layer for compound semiconductor devices on one surface of one of said doped single-crystal substrates with said layer including the same elements belonging to Groups III-V as said one substrate, using a method for crystal growth selected from the group consisting of MBE, MOCVD, and MOMBE, with said semiinsulating epitaxial layer having a low dislocation density; and forming active elements in said semiinsulating epitaxial layer, said semiinsulating epitaxial layer being used as an element-isolating region for isolating said active elements from each other.

2. A method according to claim 1, wherein said impurities are one selected from the group consisting of silicon, carbon, selenium and magnesium.

3. A method according to claim 2, wherein said elements belonging to Group III are one selected from the group consisting of gallium and indium, and said elements belonging to Group V are one selected from the group consisting of arsenic and phosphorus.

4. A method according to claim 1, wherein said III-V compound semiconductor ingot is formed of one material selected from the group consisting of gallium-arsenic, gallium-phosphorus and indium-phosphorus.

5. A method according to claim 4, wherein said compound semiconductor devices are formed only in said semiinsulating epitaxial layer, and provide an integrated circuit within the semiinsulating epitaxial layer.

6. A method according to claim 5, wherein said semiinsulating epitaxial layer has a thickness of approximately 500 nm.

* * * * *